United States Patent [19]

Schultz, Jr.

[11] Patent Number: 4,855,550

[45] Date of Patent: Aug. 8, 1989

[54] WHITE TOUCH PADS FOR CAPACITIVE TOUCH CONTROL PANELS

[75] Inventor: John Schultz, Jr., Louisville, Ky.

[73] Assignee: General Electric Company, Louisville, Ky.

[21] Appl. No.: 140,392

[22] Filed: Jan. 4, 1988

[51] Int. Cl.⁴ .................................. H03K 17/975
[52] U.S. Cl. .................................. 200/600; 361/280
[58] Field of Search ............... 200/5 A, 159 B, 52 R, 200/DIG. 04, 308, 310, 600; 361/280, 300, 330, 278; 340/365 C; 400/479.1; 341/33

[56] References Cited

U.S. PATENT DOCUMENTS

| | | | |
|---|---|---|---|
| 3,492,440 | 1/1970 | Cerbone et al. | 200/DIG. 1 X |
| 3,701,869 | 10/1972 | Jacob et al. | 200/308 |
| 4,035,795 | 7/1977 | Fosnough et al. | 340/365 C |
| 4,056,699 | 11/1977 | Jordan | 200/5 A |
| 4,123,631 | 10/1978 | Lewis | 200/52 R |
| 4,145,584 | 3/1979 | Otterlei | 200/5 A |
| 4,161,766 | 7/1979 | Castleberry et al. | 361/280 |
| 4,263,659 | 4/1981 | Hirata et al. | 340/365 C X |
| 4,293,987 | 10/1981 | Gottbreht et al. | 29/25.42 |
| 4,380,040 | 4/1983 | Posset | 361/280 |
| 4,394,643 | 7/1983 | Williams | 340/365 C |
| 4,413,252 | 11/1983 | Tyler et al. | 340/365 C |
| 4,431,882 | 2/1984 | Frame | 200/5 A |
| 4,665,324 | 5/1987 | Ogino et al. | 200/DIG. 1 X |
| 4,743,895 | 5/1988 | Alexander | 340/365 C X |

Primary Examiner—J. R. Scott
Attorney, Agent, or Firm—H. Neil Houser; Radford M. Reams

[57] ABSTRACT

A capacitive touch pad assembly which provides a touch control panel for an appliance with white touch pad appearance. A thin dielectric substrate has an outer touch electrode of a relatively dark-colored conductive material deposited on its outer surface and a pair of spatially separated inner electrodes formed on the inner surface of the dielectric layer for connecting to the control circuitry. To achieve a light-colored appearance for the touch pads, a layer of relatively light-colored non-conductive decorative material is applied to the outer surface overlaying the electrode to hide its dark color except for a small exposed area of the electrode which defines a symbol relating to the function of the pad. The exposed area may be covered by a second layer of dark conductive material or left exposed. The symbol enables direct human body member contact with the outer electrode.

7 Claims, 2 Drawing Sheets

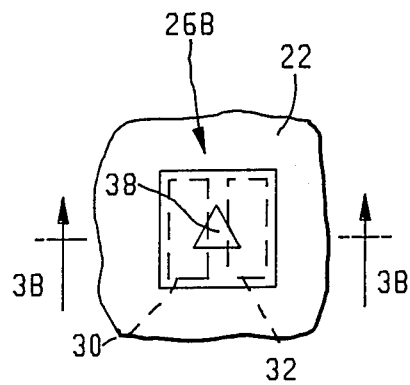
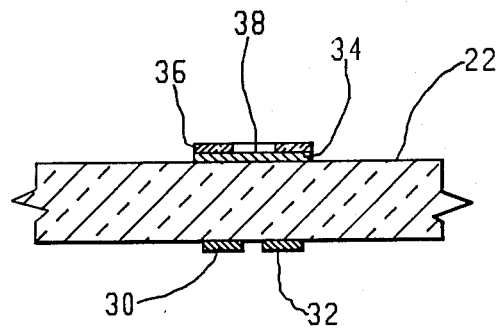
FIG.3A  FIG.3B
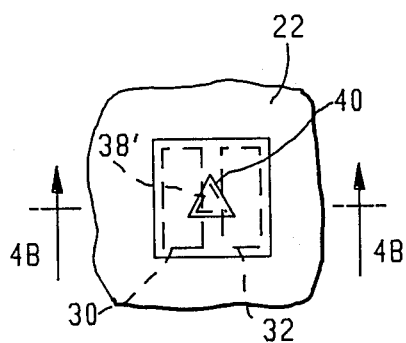
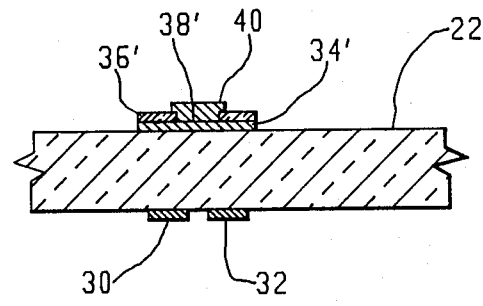
FIG.4A  FIG.4B

WHITE TOUCH PADS FOR CAPACITIVE TOUCH CONTROL PANELS

BACKGROUND OF THE INVENTION

The present invention relates to capacitive touch pads and more particularly to novel touch pad construction enabling the pleasing appearance of light-colored touch pads for an appliance control panel.

Use of glass capacitive touch control panels for appliance controls is well known. However, such control panels typically employ touch pads which are relatively dark in color. Current trends in kitchen design have created a need for a glass capacitance touch control panel with white touch pads with black lettering and/or symbols. The control panel touch pads must meet the normal standards for such panels, namely that the pad must be conductive, must be of at least a minimum size, and must be resistant to abrasion and to corrosive food stuffs. Such pads are normally applied by screen printing a ceramic enamel to which a metallic powder has been added. The printed film is then fired to form a conductive glassy film. The conventional approach provides satisfactory results for relatively dark-colored pads. However, the necessary addition of commonly used conductive metallic components to a white enamel darkens the enamel resulting in an off-white or gray color. Use of almost pure silver as the metallic component results in a reasonably satisfactory white color; however, it lacks other required properties and is subject to tarnishing on exposure to the air.

In view of the aforementioned shortcomings of the prior art, a need exists for a means of providing capacitive touch control panel having white touch pads.

OBJECT OF THE INVENTION

It is therefore a primary object of the present invention to provide a glass capacitance touch control panel for an appliance featuring white touch pads with black lettering.

SUMMARY OF THE INVENTION

A capacitive touch pad-assembly in accordance with the present invention has a thin dielectric layer or substrate having an outer touch electrode of a relatively dark-colored conductive material deposited on its outer surface and a pair of spatially separated inner electrodes formed on its inner surface for connecting to the control circuitry. To achieve a light-colored appearance for the touch pads, a layer of relatively light-colored non-conductive decorative material is applied to the outer surface overlaying the touch electrode to hide its dark color except for a small exposed area of the electrode which may define a symbol relating to the function of the pad. The exposed area provides the means for direct human body member contact with the outer touch electrode.

Preferably the outer electrode is formed by screen printing or otherwise depositing a screenable paste comprising a mixture of finely ground black glass particles, and a conductive metallic powder, in an organic medium, which is covered with a layer of non-conductive white ceramic enamel except for the small exposed area. The exposed area provides the black lettering or other symbol on the touch pad.

In accordance with another aspect of the invention, the layer of decorative material may be applied in multiple coats to provide adequate coverage to hide the underlying dark electrode. Such multiple coats if not aligned precisely may result in an unsightly uneven border for the exposed area. To relieve the alignment problem and enhance the appearance, a second layer of dark conductive material covers the exposed area and the immediately adjacent portions of the decorative layer thereby defining a slightly enlarged version of the symbol defined by the exposed area.

In accordance with yet another aspect of the invention, the outer electrode is formed of a gray or silver material to facilitate one coat coverage by the decorative layer. A layer of black conductive material covers the exposed area and the immediately adjacent portions of the decorative layer again defining a slightly enlarged version of the symbol defined by the exposed area.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings in which:

FIG. 3A is a plan view of the touch pad of FIG. 2B;

FIG. 3B is a sectional view of the touch pad of FIG. 3A taken along section lines 3B—3B;

FIG. 4A is a plan view of an alternative touch pad construction for the touch pad of FIG. 2B; and FIG. 4B is a sectional view of a touch pad of FIG. 4A taken along section lines 4B—4B.

DETAILED DESCRIPTION

Figure 1A:
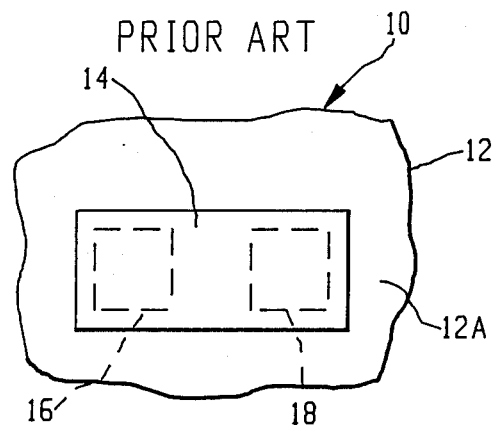
FIGS. 1A and 1B are respectively top and side views of a portion of a touch control panel illustrating a prior art touch pad construction.
Figure 1B:
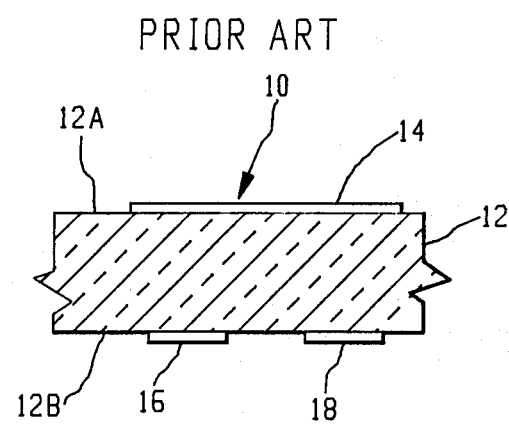

Referring initially to FIGS. 1A and 1B, a prior art capacitive touch pad construction designated generally 10 includes a dielectric substrate 12; a touch electrode 14 of electrically conductive material, fabricated on the outer facing surface 12A of substrate 12, having a preselected boundary of generally rectangular shape; and pair of inner electrodes 16 and 18 commonly referred to as a transmitting electrode and a receiving electrode respectively, fabricated on the inner surface 12B of substrate 12 underlying and substantially within the boundary of electrode 14. The transmitting and receiving electrodes are adapted for connection to well-known electronic control circuitry (not shown for simplicity). Such circuitry typically is configured to drive the transmitting electrode with a scanning pulse and to recognize a change in the amplitude of that pulse at the receiving electrode as the effective series coupling impedance between transmitting and receiving electrodes varies when touch electrode 14 is contacted by a human body member.

As described in the Background discussion such prior art touch pad assemblies feature dark-colored touch pads because the addition of metallic powder to the enamel which is deposited on the substrate to form the pad electrodes inherently darkens the enamel. Thus, there are no known conductive enamels which meet both the whiteness requirement and possess the aforementioned physical and electrical characteristics required for touch pads for an appliance control panel.

The present invention overcomes the aforementioned deficiencies of the prior art in accordance with the present invention by providing a capacitive touch pad assembly for an appliance control panel which is relatively light, preferably white, in color.

Figure 2A:
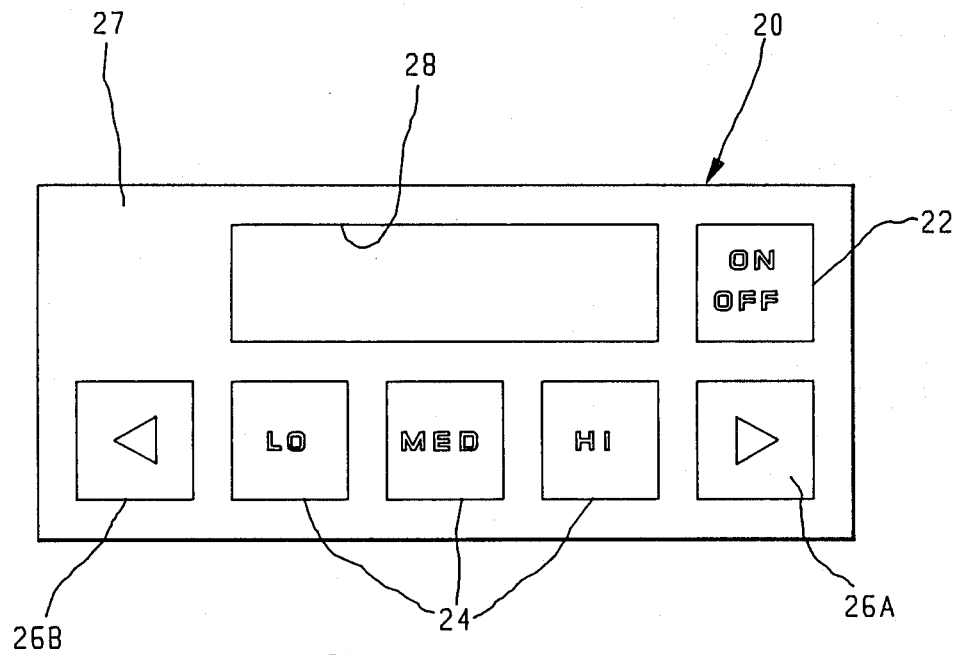
FIG. 2A is a plan view of a capacitive touch control panel for a range surface unit.

An illustrative appliance control panel 20 for a range cooktop is shown in FIG. 2A. Control panel 20 is a capacitive touch control panel with an ON/OFF touch pad 22, touch pads 24 for selecting low, medium and high power settings for the surface unit, and slew touch pads 26A and 26B for slewing the power setting selection up and down respectively. Pads 22, 24 and 26A and 26B are formed on a dielectric substrate 27 preferably of tempered glass. Normally in control panel applications the inner surface of the glass is coated with an opaque decorative film prior to application of the inner electodes. This film may be a ceramic enamel or an organic material. In the panel of the illustrative embodiment a rectangular portion of the glass is not covered by the opaque film to provide a viewing window 28 for underlying display elements which may be vacuum fluorescent devices or LEDs or other elements suitable for providing a visual indication of the selected power setting for the surface unit.

In control panel 20, each of the touch pads is a relatively light color, preferably white. The triangular slew symbol on pads 26A and 26B and the lettering on pads 22 and 24 is a relatively dark color, preferably black.

As will be described hereinafter in greater detail with respect to pad 26B, the various function indicating symbols on the pads are defined by screen printing the white enamel decorative finish over the black electrode using a drop out lettering technique such that the exposed area of the electrode defines the symbols which may be letters or other indicia for identifying the function of the pad to the user.

Figure 2B:
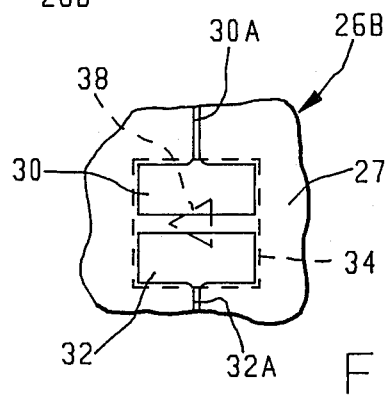
FIG. 2B is a bottom view of a portion of the control panel of FIG. 2A showing one of the control panel touch pads.

Referring now to FIGS. 2B, 3A and 3B, the construction of slew touch pad 26B will be described in greater detail. It is to be understood that the other touch pads are similarly constucted varying only in the shape of the symbol defining exposed area. FIG. 2B shows a portion of the inner side of control panel 20 containing touch pad 26B. The inner electrodes 30 and 32 for touch pad 26B are fabricated on the inner surface of substrate 27 underlying and within the boundary of outer electrode 34 in a conventional manner such as by by screen printing a conductive metallic paste on the glass in the desired configuration. Leads 30A and 32A extend from electrodes 30 and 32 respectively for connection with external electronic control circuitry (not shown).

FIG. 3A is a top view of touch pad 26B. FIG. 3B is a sectional view of the portion of control panel 20 shown in FIG. 3A taken along lines 3B—3B showing the electrodes 30, 32 and 34 together with the layer of relatively light-colored decorative material 36 which overlays electrode 34 exept for an exposed area 38 which defines the triangular "slew" symbol. In FIGS. 3A and 3B, the leads from electrodes 30 and 32 are not shown for simplicity and clarity; however, it will be appreciated that in practice leads would be employed as shown in FIG. 2B to connect the inner electrode pair to appropriate electronic circuitry for interfacing the key pad with the appliance control. In the illustrative embodiment the light-colored material is a white ceramic enamel. It will be appreciated that the thicknesses of electrodes 30, 32 and 34 and non-conductive decorative layer 36 have been grossly exaggerated for purposes of illustration and are not necessarily to scale relative to the thickness of the substrate or relative to each other. In addition in the interest of simplicity and since it is not a part of the present invention, the thin opaque decorative film on the inner surface of substrate 27 is not shown in FIG. 3B. In practice the inner electrodes 32 and 34 are applied over the opaque film.

The material for electrode 34 is a relatively dark-colored conductive material preferably comprising a mixture of finely ground black glass, a metallic component such as silver, palladium, or other suitably conductive metal element in the form of a fine powder or metallo-organic compound such as a resinate, with an organic medium and other ingredients conventional in nature, in the form of a screenable paste. This paste is deposited on the outer surface of substrate 22 by screen printing. The print is dried then fired to 600°-700° C. to remove organic components and fuse the paste resulting in a conductive film pad. A layer of light-colored non-conductive preferably white ceramic enamel is then applied, also by screen printing, to cover electrode 34 except for exposed area 38 formed by a drop-out lettering technique to define the desired symbol which for pad 26B is a triangle. The lettering on the other pads is similarly provided. This enamel layer is then dried and fired.

By this arrangement a light-colored pad area with black lettering is provided for a pleasing appearance. The black lettering also contributes functionally by enabling direct contact between a human body part and the touch electrode via the exposed symbol area for switch actuation.

In some instances a single coat of white enamel may not sufficiently hide the underlying black electrode causing the resulting touch pad to have a grayish appearance. A second coat of white enamel could be applied; however, precise alignment of it for sharp lettering would be difficult. The alternate embodiment illustrated in FIGS. 4A and 4B overcomes this problem.

In the embodiments to be described with reference to FIGS. 4A and 4B, the relatively dark outer electrode 34' and inner electrodes 30 and 32 are deposited on substrate 22 and a white enamel layer 36' is applied as hereinbefore described with reference to FIGS. 3A and 3B, except that, for reasons which will be hereinafter apparent, the exposed area 38' left uncovered by the layer of white enamel 36' is preferably somewhat smaller than that desired for the symbol with respect to appearance considerations. The white layer 36' may be applied in multiple coats to provide the desired hiding of the black electrode. However, it is very difficult to control alignment with sufficient precision to retain sharp symbol definition with multiple coats. To compensate for such multiple coat alignment problems, a second layer 40 of black conductive material is applied to the exposed area. Actually the patten for screen printing of this second black layer is slightly larger than the exposed area to overlap adjacent portions of the white layer. This overlap provides alignment compensation for the symbol with the underlying symbol and also covers the edges of the exposed area which may have been blurred by the application of multiple coats. Touching the symbol defined by layer 40 will actuate the touch pad just as in the embodiment of FIGS. 3A and 3B.

As yet another alternative using the basic fabrication technique just described with reference to FIGS. 4A and 4B, electrode 34' may be formed using an electrode material having a lighter grayish color such as with greater silver content. Since the electrode is ultimately completely sealed by additional layers, tarnishing is not a concern. This lighter color enables a single coat of white enamel to more reliably hide the still relatively dark electrode. However, the resulting exposed area is gray rather than the desired black. This is remedied by again applying layer 40 of black conductive material to the exposed pattern. The overlap of the enlarged pattern allows for some misalignment during application.

In both the black electrode and gray electrode embodiments just described, the enlarged black symbol provides electrical continuity from the point of contact with the human body member to the underlying electrode serving as a capacitor plate, enabling touch pad actuation by touching the symbol.

While specific embodiments of the invention have been illustrated and described herein, it is realized that numerous modifications and changes may occur to those skilled in the art. It is therefore to be understood that the appended claims are intended to cover all such modifications and changes which fall within the true spirit and scope of the invention.

What is claimed is:

1. A capacitive touch pad assembly comprising:
   a layer of dielectric material having an outer surface and an inner surface;
   an outer electrode comprising a first thin layer of relatively dark-colored conductive material fabricated on said outer surface to be responsive to contact with a human body member;
   a pair of spatially separated inner electrodes fabricated on said inner surface substantially within the boundaries of said outer electrode; said inner electrodes being adapted for electrical contact with external electronic control circuitry;
   a layer of relatively light-colored non-conductive decorative material applied to said outer surface substantially overlaying said outer electrode, surrounding a small exposed area of said outer electrode, said exposed area defining a symbol to be touched;
   whereby said pad provides a pleasing light-colored appearance with a contrasting dark symbol, said symbol providing the means for direct human body member contact with said outer electrode.

2. The touch pad assembly of claim 1 wherein said relatively dark conductive material is a screenable paste comprising a mixture of finely ground black glass, a conductive metallic component and an organic medium.

3. The touch pad assembly of claim 2 wherein said relatively light-colored non-conductive decorative material comprises a white ceramic enamel.

4. The touch pad assembly of claim 1 wherein said symbol identifies the function of said touch pad.

5. A capacitive touch pad assembly comprising:
   a layer of dielectric material having an outer surface and an inner surface;
   a first outer electrode comprising a thin layer of relatively dark-colored conductive material fabricated on said outer surface to be responsive to contact with a human body member;
   a pair of spatially separated inner electrodes fabricated on said inner surface underlying said first electrode and adapted for electrical connection with external electronic circuitry;
   a thin layer of relatively light-colored non-conductive decorative material deposited on said outer surface overlying said outer electrode defining an uncovered area of said outer electrode; and
   a second outer electrode comprising a second thin layer of relatively dark-colored conductive material deposited on said uncovered area and that portion of said thin decorative layer adjacent said uncovered area, said second layer defining a symbol to be touched;
   whereby said pad provides a pleasing light-colored appearance with a contrasting dark symbol, said symbol being exposed for direct contact with a human body member and in good electrical contact with said outer electrode.

6. The touch pad assembly of claim 5 wherein said relatively dark conductive material is a screenable paste comprising a mixture of finely ground black glass, a conductive metallic component and an organic medium.

7. The touch pad assembly of claim 6 wherein said relatively light-colored non-conductive decorative material comprises a white ceramic enamel.

* * * * *